United States Patent
Yang

(10) Patent No.: US 10,089,174 B2
(45) Date of Patent: Oct. 2, 2018

(54) FLASH MEMORY CONTROLLER AND MEMORY DEVICE FOR ACCESSING FLASH MEMORY MODULE, AND ASSOCIATED METHOD

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/232,814

(22) Filed: Aug. 10, 2016

(65) Prior Publication Data

US 2017/0046225 A1 Feb. 16, 2017

(30) Foreign Application Priority Data

Aug. 10, 2015 (TW) .............................. 104125905 A

(51) Int. Cl.
| | | |
|---|---|---|
| *G06F 11/10* | (2006.01) | |
| *G06F 3/06* | (2006.01) | |
| *G11C 16/26* | (2006.01) | |
| *G11C 11/56* | (2006.01) | |
| *G11C 29/52* | (2006.01) | |
| *G11C 7/10* | (2006.01) | |
| *G11C 16/10* | (2006.01) | |
| *G11C 16/04* | (2006.01) | |

(52) U.S. Cl.
CPC ........ *G06F 11/1072* (2013.01); *G11C 7/1006* (2013.01); *G11C 11/5628* (2013.01); *G11C 11/5642* (2013.01); *G11C 29/52* (2013.01); *G11C 16/0483* (2013.01); *G11C 16/10* (2013.01); *G11C 16/26* (2013.01); *G11C 2211/5641* (2013.01)

(58) Field of Classification Search
CPC .... G06F 11/1072; G06F 3/0619; G06F 3/064; G06F 3/0679; G11C 11/5628; G11C 11/5642; G11C 29/52; G11C 7/1006; G11C 16/0483; G11C 16/10; G11C 16/26; G11C 2211/5641
See application file for complete search history.

(56) References Cited

U.S. PATENT DOCUMENTS 4,271,520 A * 6/1981 Coombes .............. H04L 1/0057
375/365
8,732,543 B1 * 5/2014 Yang ................. H03M 13/2906
714/755
(Continued)

FOREIGN PATENT DOCUMENTS

WO WO 2015079168 A1 * 6/2015 ............ H03M 13/23

*Primary Examiner* — Kyle Vallecillo
(74) *Attorney, Agent, or Firm* — Winston Hsu

(57) ABSTRACT

A method for accessing a flash memory module includes: sequentially writing Nth-(N+K)th data to a plurality of flash memory chips of the flash memory module, and encoding the Nth-(N+K)th data to generate Nth-(N+K)th ECCs, respectively, where the Nth-(N+K)th ECCs are used to correct errors of the Nth-(N+K)th data, respectively, and N and K are positive integers; and writing the (N+K+1)th data to the plurality of flash memory chips of the flash memory module, and encoding the (N+K+1)th data with at least one of the Nth-(N+K)th ECCs to generate the (N+K+1)th ECC.

18 Claims, 11 Drawing Sheets

(56) References Cited

U.S. PATENT DOCUMENTS

| | | | |
|---|---|---|---|
| 8,996,960 B1 | 3/2015 | Saxena | |
| 9,081,718 B2 | 7/2015 | Reche | |
| 9,384,093 B1* | 7/2016 | Aiello | G06F 11/1088 |
| 2002/0184592 A1* | 12/2002 | Koga | G06F 11/1032 |
| | | | 714/763 |
| 2003/0023856 A1* | 1/2003 | Horne | G06F 11/3624 |
| | | | 713/187 |
| 2008/0163031 A1* | 7/2008 | Hsieh | G06F 11/1068 |
| | | | 714/773 |
| 2009/0222709 A1* | 9/2009 | Lin | H04L 1/0057 |
| | | | 714/776 |
| 2012/0185747 A1* | 7/2012 | Kim | G06F 11/1068 |
| | | | 714/755 |
| 2013/0010690 A1* | 1/2013 | Cheng | H04L 1/007 |
| | | | 370/328 |
| 2013/0179753 A1 | 7/2013 | Flynn | |
| 2013/0205183 A1 | 8/2013 | Fillingim | |
| 2014/0281599 A1 | 9/2014 | Grimsrud | |
| 2015/0058661 A1 | 2/2015 | Yang | |
| 2015/0058699 A1 | 2/2015 | Yang | |
| 2015/0058700 A1 | 2/2015 | Yang | |

* cited by examiner

|  | Page address | | | |
|---|---|---|---|---|
| Low page | P0L | P1L | P2L | P3L |
| Middle page | P0M | P1M | P2M | P3M |
| Upper page | P0U | P1U | P2U | P3U |
| Low page | P4L | P5L | P6L | P7L |
| Middle page | P4M | P5M | P6M | P7M |
| Upper page | P4U | P5U | P6U | P7U |

WL_G0 { (Low/Middle/Upper for first block)
WL_G1 { (Low/Middle/Upper for second block)

⋮

| Low page | P188L | P189L | P190L | P191L |
|---|---|---|---|---|
| Middle page | P188M | P189M | P190M | P191M |
| Upper page | P188U | P189U | P190U | P191U |

|  | | Chip 512 | Chip 514 | Chip 522 | Chip 524 | ECC |
|---|---|---|---|---|---|---|
| WL_G0 | WL0 | P0 | P0 | P0 | P0 | S0 |
|  | WL1 | P1 | P1 | P1 | P1 | S1 |
|  | WL2 | P2 | P2 | P2 | P2 | S2 |
|  | WL3 | P3 | P3 | P3 | P3 | S3 |
| WL_G1 | WL4 | P4 | P4 | P4 | P4 | S4 |
|  | WL5 | P5 | P5 | P5 | P5 | S5 |
|  | WL6 | P6 | P6 | P6 | P6 | S6 |
|  | WL7 | P7 | P7 | P7 | P7 | S7 |
| WL_G2 | WL8 | P8 | P8 | P8 | P8 | S8 |
|  | WL9 | P9 | P9 | P9 | P9 | S9 |
|  | WL10 | P10 | P10 | P10 | P10 | S10 |
|  | WL11 | P11 | P11 | P11 | P11 | S11 |
| WL_G3 | WL12 | P12 | P12 | P12 | P12 | S12 |
|  | WL13 | P13 | P13 | P13 | P13 | S13 |
|  | WL14 | P14 | P14 | P14 | P14 | S14 |
|  | WL15 | P15 | P15 | P15 | P15 | S15 |
| WL_G4 | WL16 | P16 | P16 | P16 | P16 | S16 |
|  | WL17 | P17 | P17 | P17 | P17 | S17 |
|  | WL18 | P18 | P18 | P18 | P18 | S18 |
|  | WL19 | P19 | P19 | P19 | P19 | S19 |

⋮

|  | | | | | | |
|---|---|---|---|---|---|---|
| WL_G46 | WL184 | P184 | P184 | P184 | P184 | S184 |
|  | WL185 | P185 | P185 | P185 | P185 | S185 |
|  | WL186 | P186 | P186 | P186 | P186 | S186 |
|  | WL187 | P187 | P187 | P187 | P187 | S187 |
| WL_G47 | WL188 | P188 | P188 | P188 | P188 | S188 |
|  | WL189 | P189 | P189 | P189 | P189 | S189 |
|  | WL190 | P190 | P190 | P190 | P190 | S190 |
|  | WL191 | P191 | P191 | P191 | P191 | S191 |

FIG. 6

|         |       | Chip 512 | Chip 514 | Chip 522 | Chip 524 | ECC  |
|---------|-------|----------|----------|----------|----------|------|
| WL_G0   | WL0   | P0       | P0       | P0       | P0       | S0   |
|         | WL1   | P1       | P1       | P1       | P1       | S1   |
|         | WL2   | P2       | P2       | P2       | P2       | S2   |
|         | WL3   | P3       | P3       | P3       | P3       | S3   |
| WL_G1   | WL4   | P4       | P4       | P4       | P4       | S4   |
|         | WL5   | P5       | P5       | P5       | P5       | S5   |
|         | WL6   | P6       | P6       | P6       | P6       | S6   |
|         | WL7   | P7       | P7       | P7       | P7       | S7   |
| WL_G2   | WL8   | P8       | P8       | P8       | P8       | S8   |
|         | WL9   | P9       | P9       | P9       | P9       | S9   |
|         | WL10  | P10      | P10      | P10      | P10      | S10  |
|         | WL11  | P11      | P11      | P11      | P11      | S11  |
| WL_G3   | WL12  | P12      | P12      | P12      | P12      | S12  |
|         | WL13  | P13      | P13      | P13      | P13      | S13  |
|         | WL14  | P14      | P14      | P14      | P14      | S14  |
|         | WL15  | P15      | P15      | P15      | P15      | S15  |
| WL_G4   | WL16  | P16      | P16      | P16      | P16      | S16  |
|         | WL17  | P17      | P17      | P17      | P17      | S17  |
|         | WL18  | P18      | P18      | P18      | P18      | S18  |
|         | WL19  | P19      | P19      | P19      | P19      | S19  |

⋮

|         |        | Chip 512 | Chip 514 | Chip 522 | Chip 524 | ECC   |
|---------|--------|----------|----------|----------|----------|-------|
| WL_G46  | WL184  | P184     | P184     | P184     | P184     | S184  |
|         | WL185  | P185     | P185     | P185     | P185     | S185  |
|         | WL186  | P186     | P186     | P186     | P186     | S186  |
|         | WL187  | P187     | P187     | P187     | P187     | S187  |
| WL_G47  | WL188  | P188     | P188     | P188     | P188     | S188  |
|         | WL189  | P189     | P189     | P189     | P189     | S189  |
|         | WL190  | P190     | P190     | P190     | P190     | S190  |
|         | WL191  | P191     | P191     | P191     | P191     | S191  |

FIG. 8

|  | | Chip 512 | Chip 514 | Chip 522 | Chip 524 | ECC |
|---|---|---|---|---|---|---|
| WL_G0 | WL0 | P0 | P0 | P0 | P0 | S0 |
|  | WL1 | P1 | P1 | P1 | P1 | S1 |
|  | WL2 | P2 | P2 | P2 | P2 | S2 |
|  | WL3 | P3 | P3 | P3 | P3 | S3 |
| WL_G1 | WL4 | P4 | P4 | P4 | P4 | S4 |
|  | WL5 | P5 | P5 | P5 | P5 | S5 |
|  | WL6 | P6 | P6 | P6 | P6 | S6 |
|  | WL7 | P7 | P7 | P7 | P7 | S7 |
| WL_G2 | WL8 | P8 | P8 | P8 | P8 | S8 |
|  | WL9 | P9 | P9 | P9 | P9 | S9 |
|  | WL10 | P10 | P10 | P10 | P10 | S10 |
|  | WL11 | P11 | P11 | P11 | P11 | S11 |
| WL_G3 | WL12 | P12 | P12 | P12 | P12 | S12 |
|  | WL13 | P13 | P13 | P13 | P13 | S13 |
|  | WL14 | P14 | P14 | P14 | P14 | S14 |
|  | WL15 | P15 | P15 | P15 | P15 | S15 |
| WL_G4 | WL16 | P16 | P16 | P16 | P16 | S16 |
|  | WL17 | P17 | P17 | P17 | P17 | S17 |
|  | WL18 | P18 | P18 | P18 | P18 | S18 |
|  | WL19 | P19 | P19 | P19 | P19 | S19 |

⋮

| WL_G46 | WL184 | P184 | P184 | P184 | P184 | S184 |
|---|---|---|---|---|---|---|
|  | WL185 | P185 | P185 | P185 | P185 | S185 |
|  | WL186 | P186 | P186 | P186 | P186 | S186 |
|  | WL187 | P187 | P187 | P187 | P187 | S187 |
| WL_G47 | WL188 | P188 | P188 | P188 | P188 | S188 |
|  | WL189 | P189 | P189 | P189 | P189 | S189 |
|  | WL190 | P190 | P190 | P190 | P190 | S190 |
|  | WL191 | P191 | P191 | P191 | P191 | S191 |

FIG. 10

FLASH MEMORY CONTROLLER AND MEMORY DEVICE FOR ACCESSING FLASH MEMORY MODULE, AND ASSOCIATED METHOD

BACKGROUND OF THE INVENTION

1. Field of the Invention

The present invention relates to a flash memory, and more particularly, to a method, flash memory controller and memory apparatus for accessing a flash memory module.

2. Description of the Prior Art

In order to make a flash memory of high density and large capacity, manufacturers have applied 3D techniques to generate 3D NAND-type flash memories. The entire structure of a 3D NAND-type flash memory is different from that of traditional flash memories. In particular, the shapes and locations of floating gates of the 3D NAND-type flash memory are different, thus introducing some problems when writing/reading data. In some 3D NAND-type flash memories, a plurality of word lines are grouped to a word line group, and a plurality of word line groups may jointly comprise a portion of a control circuit. Hence, when data fails to be written to floating gate transistors of a word line of the word line group, errors may occur on data of floating gate transistors of other word lines. Further, if one word line in a word line group is short circuited or has an open circuit, some errors will occur on floating gate transistors of other word lines in the word line group. Therefore, there is a need for a method to maintain the correctness of data without occupying too much memory space.

SUMMARY OF THE INVENTION

An objective of the present invention is to provide a method, flash memory controller and memory apparatus for accessing a flash memory module, which utilizes an error correction technique similar to redundant array of independent disks (RAID). The present invention may greatly save memory space, thus solving problems existing in the related arts.

According to an embodiment of the present invention, a method for accessing a flash memory module comprises: encoding Nth data to generate an Nth ECC, wherein the Nth ECC is arranged to perform error correction upon the Nth data, and N is an positive integer; writing the Nth data to the flash memory module; writing the Nth ECC to the flash memory module; and when the Nth data is successfully written to the flash memory module, deleting at least a portion of the Nth ECC in the flash memory module while reserving the Nth data in the flash memory module.

According to an embodiment of the present invention, a method for accessing a flash memory module comprises: writing Nth data to a plurality of flash memory chips in the flash memory module, and encoding the Nth data to generate an Nth ECC, wherein the Nth ECC is arranged to perform error correction upon the Nth data written to the plurality of flash memory chips, and N is an positive integer; when it is determined that that the Nth data has been successfully written to the plurality of flash memory chips, reserving the Nth ECC; sequentially writing the (N+1)th-(N+M)th data to the plurality of flash memory chips in the flash memory module, and encoding the (N+1)th-(N+M)th data to generate the (N+1)th-(N+M)th ECC, respectively, wherein the (N+1)th-(N+M)th ECCs are arranged to perform error correction upon the (N+1)th-(N+M)th data written to the plurality of flash memory chips, respectively, and M is an positive integer; and when it is determined that the (N+M) data has been successfully written to the plurality of flash memory chips, deleting the Nth-(N+M)th ECCs.

According to another embodiment of the present invention, a flash memory controller is disclosed. The flash memory controller is arranged to access a flash memory module, and the flash memory controller comprises: a memory arranged to store a program code, a microprocessor arranged to execute the program code to control access of the flash memory module, and an encoder; wherein the microprocessor encodes Nth data to generate an Nth ECC, and the Nth ECC is arranged to perform error correction upon the Nth data, wherein N is an positive integer; the microprocessor writes the Nth data to the flash memory module, and writes the Nth ECC to the flash memory module; and when the Nth data is successfully written to the flash memory module, the microprocessor deletes at least a portion of the Nth ECC in the flash memory module while reserving the Nth data in the flash memory module.

According to another embodiment of the present invention, a flash memory controller is disclosed. The flash memory controller is arranged to access a flash memory module, and the flash memory controller comprises: a memory, arranged to store a program code; a microprocessor, arranged to execute the program code to control the access of the flash memory module; and an encoder; wherein the microprocessor writes Nth data to a plurality of flash memory chips in the flash memory module, and the encoder encodes the Nth data to generate an Nth ECC, wherein the Nth ECC is arranged to perform error correction upon the Nth data written to the plurality of flash memory chips, wherein N is an positive integer; when the microprocessor determines that the Nth data has been successfully written to the plurality of flash memory chips, the Nth ECC is reserved; the microprocessor sequentially writes (N+1)th-(N+M)th data to the plurality of flash memory chips in the flash memory module, respectively, and the encoder encodes the (N+1)th-(N+M)th data, to generate (N+1)th-(N+M)th ECC, respectively, wherein the (N+1)th-(N+M)th ECCs are arranged to perform error correction upon the (N+1)th-(N+M)th data written to the plurality of flash memory chips, respectively, and M is an positive integer; and the microprocessor deletes the Nth-(N+M)th ECC when it is determined that the (N+M)th data has been successfully written to the plurality of flash memory chips.

According to another embodiment of the present invention, a memory apparatus is disclosed. The memory apparatus comprises: a flash memory module and a flash memory controller arranged to access the flash memory module. The flash memory controller is arranged to: encode Nth data to generate an Nth ECC, wherein the Nth ECC is arranged to perform error correction upon the Nth data, and N is an positive integer; write the Nth data to the flash memory module; write the Nth ECC to the flash memory module; and delete at least a portion of the Nth ECC in the flash memory module after the Nth data successfully is written to the flash memory module while reserving the Nth data in the flash memory module.

According to another embodiment of the present invention, a memory apparatus comprises: a flash memory module; and a flash memory controller, arranged to access the flash memory module; wherein the flash memory controller writes Nth data to a plurality of flash memory chips in the flash memory module, and encodes the Nth data to generate an Nth ECC, wherein the Nth ECC is arranged to perform error correction upon the Nth data written to the plurality of flash memory chips, and N is an positive integer; when the flash memory controller determines that the Nth data has been successfully written to the plurality of flash memory chips, the Nth ECC is reserved. The flash memory controller sequentially writes the (N+1)th-(N+M)th data to the plurality of flash memory chips in the flash memory module, respectively, and encodes the (N+1)th-(N+M)th data to generate (N+1)th-(N+M)th ECC, respectively, wherein the (N+1)th-(N+M)th ECCs are arranged to perform error correction upon the (N+1)th-(N+M)th data written to the plurality of flash memory chips, respectively, and M is an positive integer. The flash memory controller deletes the Nth-(N+M)th ECC when it is determined that the (N+M)th data has been successfully written to the plurality of flash memory chips.

According to another embodiment of the present invention, a method for accessing a flash memory module is provided. The method comprises: sequentially writing Nth-(N+K)th data to a plurality of flash memory chips in the flash memory module, respectively, and encoding the Nth-(N+K)th data to generate Nth-(N+K)th ECCs, respectively, wherein the Nth-(N+K)th ECCs are arranged to perform error correction upon the Nth-(N+K)th data written to the plurality of flash memory chips, respectively, and N and K are positive integers; and writing (N+K+1)th data to the plurality of flash memory chips in the flash memory module, and encoding at least one of the Nth-(N+K)th ECCs together with the (N+K+1)th data, to generate the (N+K+1)th ECC.

According to another embodiment of the present invention, a flash memory controller is disclosed. The flash memory controller is arranged to access a flash memory module, and the flash memory controller comprises: a memory arranged to store a program code, a microprocessor arranged to execute the program code to control the access of the flash memory module, and an encoder. The microprocessor sequentially writes Nth-(N+K)th data to a plurality of flash memory chips in the flash memory module, respectively, and the encoder encodes the Nth-(N+K)th data to generate Nth-(N+K)th ECCs, respectively, wherein the Nth-(N+K)th ECCs are arranged to perform error correction upon the Nth-(N+K)th data written to the plurality of flash memory chips, respectively, and N and K are positive integers. The microprocessor writes (N+K+1)th data to the plurality of flash memory chips in the flash memory module, and the encoder encodes at least one of the Nth-(N+K)th ECCs together with the (N+K+1)th data, to generate the (N+K+1)th ECC.

According to another embodiment of the present invention, a memory apparatus is provided. The memory apparatus comprises: a flash memory module, and a flash memory controller arranged to access the flash memory module; wherein the flash memory controller sequentially writes Nth-(N+K)th data to a plurality of flash memory chips in the flash memory module, respectively, and encodes the Nth-(N+K) th data to generate Nth-(N+K)th ECCs, respectively, wherein the Nth-(N+K)th ECCs are arranged to perform error correction on the Nth-(N+K)th data written to the plurality of flash memory chips, respectively, and N and K are positive integers. The flash memory controller writes (N+K+1)th data to the plurality of flash memory chips in the flash memory module, and encodes at least one of the Nth-(N+K)th ECCs together with the (N+K+1)th data, to generate the (N+K+1)th ECC.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating a plurality of word line groups in a block.

FIG. 6 is a diagram illustrating a flash memory controller writing data to a super block according to a first embodiment of the present invention.

FIG. 8 is a diagram illustrating a flash memory controller writing data to a super block according to a second embodiment of the present invention.

FIG. 10 is a diagram illustrating a flash memory controller writing data to a super block according to a third embodiment of the present invention.

DETAILED DESCRIPTION

Figure 1:
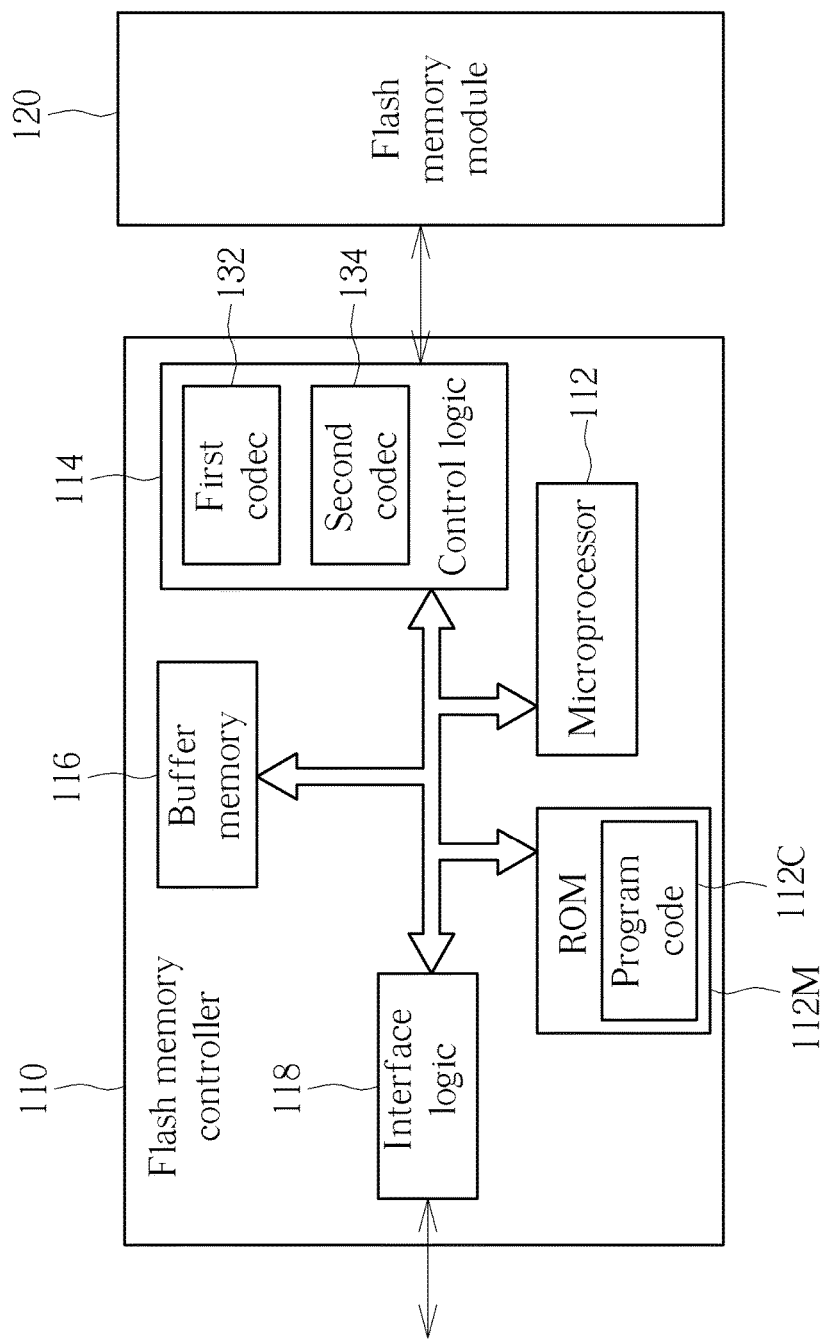
FIG. 1 is a diagram illustrating a memory apparatus according to an embodiment of the present invention.

Refer to FIG. 1, which is a diagram illustrating a memory apparatus 100 according to an embodiment of the present invention, wherein the memory apparatus 100 in this embodiment may be a portable memory apparatus conforming to the SD/MMC, CF, MS, XD specifications. The memory apparatus 100 comprises a flash memory module 120 and a flash memory controller 110. The flash memory controller 110 is arranged to access the flash memory module 120. In this embodiment, the flash memory controller 110 comprises a microprocessor 112, a read only memory (ROM) 112M, a control logic 114, a buffer memory 116 and an interface logic 118. The ROM 112M is arranged to store a program code 112C, and the microprocessor 112 is arranged to execute the program code 112C to control the access of the flash memory module 120.

The flash memory module 120 comprises a plurality of blocks, and the controller (e.g. the flash memory controller 110 for controlling the microprocessor 112 to execute the program code 112C) uses a block as the unit of copying, erasing, combining data, etc. Further, a block may record a certain amount of pages, wherein the controller (e.g. the memory controller 110 for controlling the microprocessor 112 to execute the program code 112C) uses a page as the unit of writing data to the flash memory module 120.

In practice, the memory controller 110 may utilize elements therein to perform various control operations. For example, the program code 112C may utilize the control logic 114 to control access of the flash memory module 120 (especially the access operation of at least one block or at least one page), utilize the buffer memory 116 to perform buffering operations, and utilize the interface logic 118 to communicate with a host device.

The control logic 114 comprises a first codec 132 and a second codec 134, wherein the first codec 132 is arranged to encode data written to a block of the flash memory module 120 to generate corresponding error correction codes (ECCs). The ECC is generated by the first codec 132 based on the contents written to a sector of a page, and the generated ECC and the data contents of the sector will be written to the page. The second codec 134 is a redundant array of independent disks (RAID) codec, wherein the second codec 134 is arranged to encode data written to a plurality of flash memory chips, to generate corresponding ECCs. The detailed operations are as follows.

Figure 2:
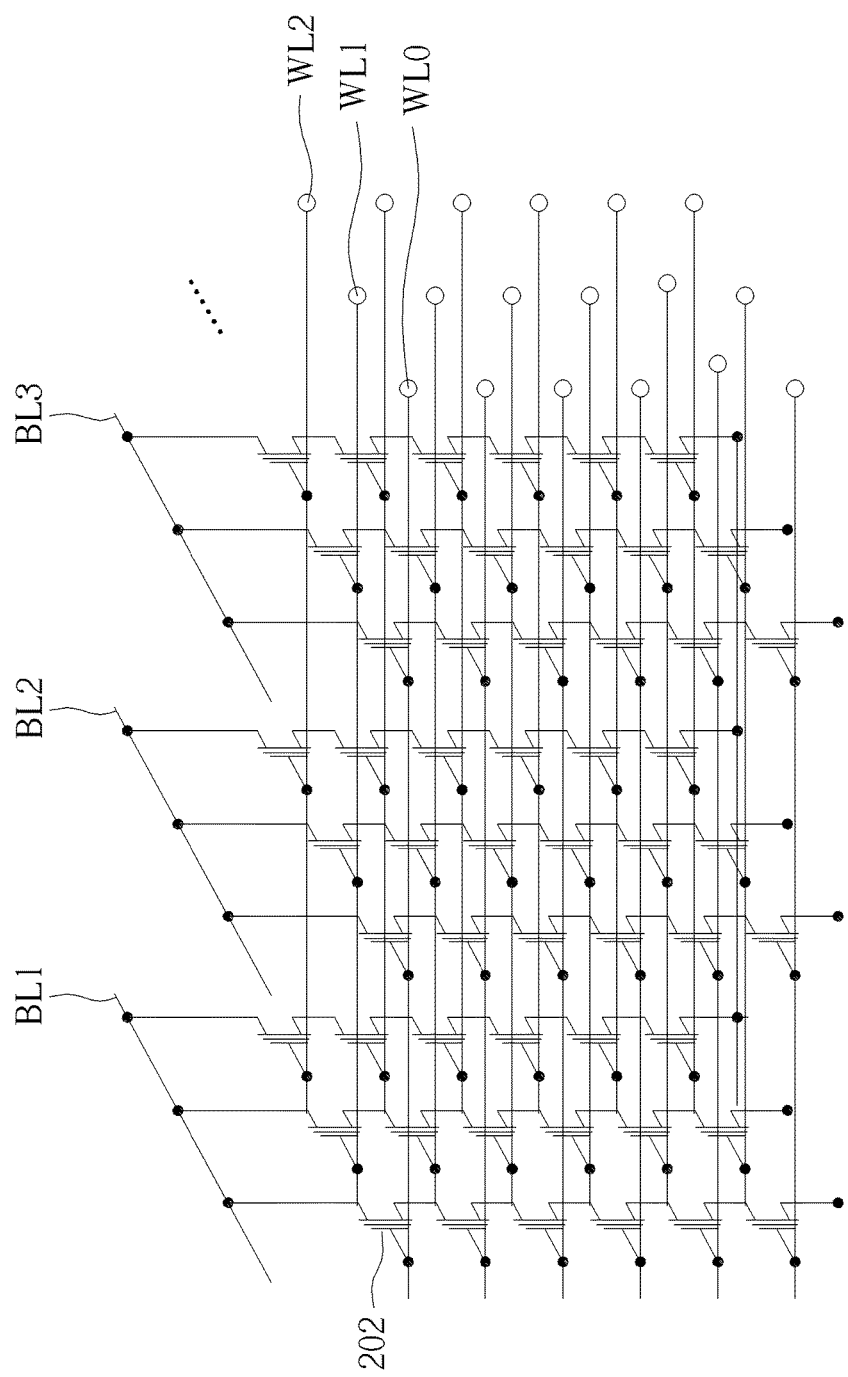
FIG. 2 is a diagram illustrating a 3D NAND-type flash memory.

In this embodiment, the flash memory module 120 is a 3D NAND-type flash memory module. Refer to FIG. 2, which is a diagram illustrating a 3D NAND-type flash memory. The 3D NAND-type flash memory comprises a plurality of floating gate transistors 202 forming a 3D NAND-type flash memory structure with a plurality of bit lines (e.g. the bit lines BL1-BL3) and a plurality of word lines (e.g. the word lines WL1-WL3).

In FIG. 2, taking the uppermost plane as an example, all floating gate transistors on the word line WL0 form a page, all floating gate transistor on the word line WL1 form another page, all floating gate transistors on the word line WL2 form yet another page, and so on. Further, according to different ways of writing the flash memory, the definitions between the word line WL0 and pages (e.g. logic pages) may be different. Specifically, regarding single-level cells (SLCs), all floating gate transistors on the word line WL0 correspond to a single logic page only; regarding multiple-level cells (MLCs), all floating gate transistors on the word line WL0 correspond to two logic pages; regarding triple-level cells (TLCs), all floating gate transistors on the word line WL0 correspond to three logic pages; and regarding quad-level cells (QLCs), all floating gate transistors on the word line WL0 correspond to four logic pages. Since one skilled in the art will know the structure of the 3D NAND-type flash memory and the relationship between word lines and pages, some detail is omitted here for brevity. Further, in the operations of the flash memory controller 110, a page is the smallest write unit, and a block is the smallest erase unit.

Figure 3:
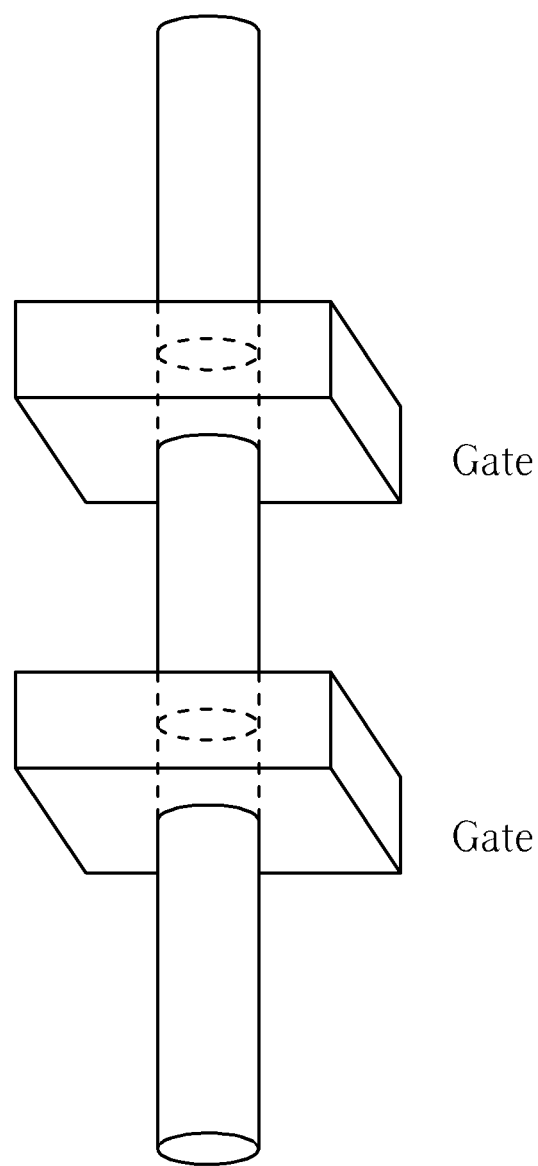
FIG. 3 is a diagram illustrating the structure of a floating gate transistor.

Refer to FIG. 3, which is a diagram illustrating the structure of a floating gate transistor 202. As shown in FIG. 3, the gate and floating gate of each floating gate transistor surround the source and drain to enhance the channel sensing ability.

Note that FIGS. 2 and 3 are merely examples of the 3D NAND-type flash memory and the floating gate transistor 202, and are not meant to be limitations of the present invention. The present invention may comprise other types of 3D NAND-type flash memories. For example, apart of the word lines may be connected to each other, and the design of the floating gate transistor 202 may be modified.

As mentioned in the related art, a plurality of word lines may be defined as a word line group, and a plurality of word line groups comprise a portion of a control circuit. Hence, when an error (e.g. writing failure) occurs in the floating gate transistors of a word line of the word line group, the errors will also occur in data of floating gate transistors on other word lines of the word line group. Refer to FIG. 4, which is a diagram illustrating a plurality of word line groups in a block. In this embodiment, the block comprises all floating gate transistors of 192 word lines, wherein each word line group comprises four word lines, and the block shown in FIG. 4 comprises 48 word line groups WL_G0-WL_G47. The block is a TLC block, where floating gate transistors on each word line may be arranged to store data of three pages. As shown in FIG. 4, taking the word line group WL_G0 as an example, the floating gate transistors on the word line WL0 may be arranged to store the low page P0L, the middle page P0M and the upper page P0U; the floating gate transistors on the word line WL1 may be arranged to store the lower page P1L, the middle page P1M and the upper page P1U; the floating gate transistors on the word line WL2 may be arranged to store the lower page P2L, the middle page P2M and the upper page P2U; and the floating gate transistors on the word line WL3 may be arranged to store the lower page P3L, the middle page P3M and the upper page P3U. When writing data of the controller to the page of the word line group WL_G0, the data is sequentially written to the floating gate transistors of the word lines WL0, WL1, WL2 and WL3. Even if the data on the word lines WL0 and WL1 has been successfully written, once an error occurs when writing data to the word line WL2, the error will also occur in the data that was previously successfully written to the word lines WL0 and WL1. The following embodiment will introduce a method for solving this problem.

Figure 5:
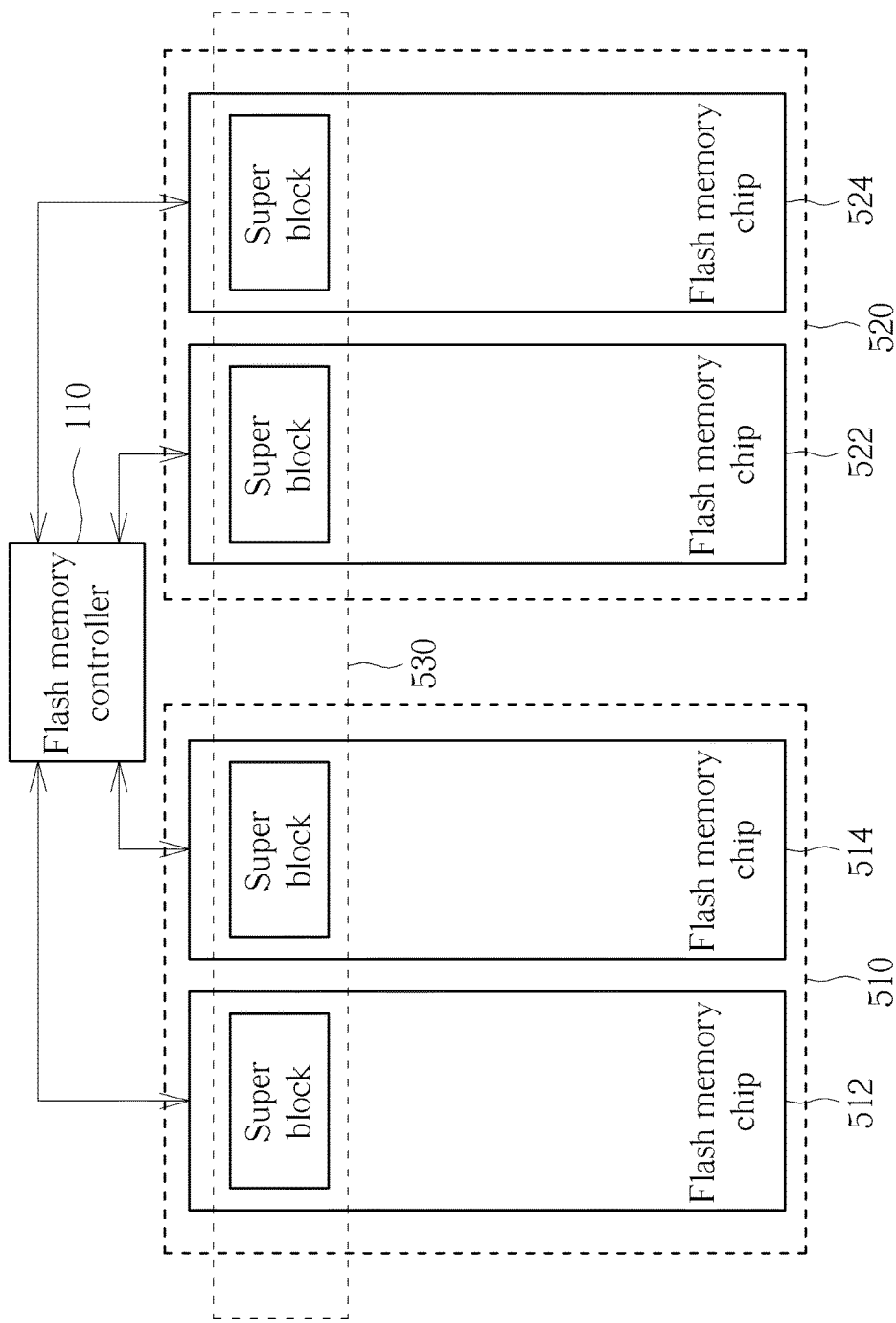
FIG. 5 is a diagram illustrating a flash memory controller writing data to a flash memory module.

Refer to FIG. 5, which is a diagram illustrating the flash memory controller 110 writing data to the flash memory module 120. As shown in FIG. 5, the flash memory module 120 comprises a plurality of channels (e.g. the channels 510 and 520), and each channel comprises a corresponding sequencer in the flash memory controller 110 and comprises a plurality of flash memory chips. For example, the channel 510 comprises the flash memory chips 512 and 514, and the channel 520 comprises the flash memory chips 522 and 524. Further, a block of the flash memory chips 512, 514, 522 and 524 will be configured as a super block 530, and the flash memory controller 110 will use the super block 530 as the unit of writing data.

Refer to FIGS. 5 and 6, wherein FIG. 6 is a diagram illustrating the flash memory controller 110 writing data to the super block 530 according to a first embodiment of the present invention. In the following descriptions, each data is written to a page of the flash memory chips 512, 514, 522 and 524. The first data will be written to the first page P0 of each of the flash memory chips 512, 514, 522 and 524, the second data will be written to the second page p1 of each of the flash memory chips 512, 514, 522 and 524, and the Nth data will be written to the Nth page P(N−1) of each of the flash memory chips 512, 514, 522 and 524. Referring to FIG. 6, when the flash memory controller 110 is going to write the first data to the super block 530, the second codec 134 in the flash memory controller 110 will encode the first data first to generate a first ECC S0, wherein the second codec 134 may adopt the Reed-Solomon (RS) encoding algorithm or an exclusive-OR (XOR) calculation to encode the data written to the first page P0 in each of the flash memory chips 512, 514, 522 and 524, for generating the first ECC S0. Then, the first codec 132 respectively encodes the first data to generate a corresponding ECC, and writes the first data together with the ECC generated by the first codec 132 to the first page P0 of each of the flash memory chips 512, 514, 522 and 524. Specifically, the first codec 132 encodes a first portion of data in the first data to generate a first ECC, and then writes the first portion of data and the first ECC to the first page P0 of the flash memory chip 512; the first codec 132 encodes a second portion of data in the first data to generate a second ECC, and then writes the second portion of data and the second ECC to the first page P0 of the flash memory chip 514; the first codec 132 encodes a third portion of data in the first data to generate a third ECC, and then writes the third portion of data and the third ECC to the first page P0 of the flash memory chip 522; and the first codec 132 encodes a fourth portion of data (i.e. the last portion of data) to generate a fourth ECC, and then writes the fourth portion of data and the fourth ECC to the first page P0 of the flash memory chip 524.

The first ECC S0 generated by the second codec 134 is arranged to perform error correction when errors occur in the first page P0 of the flash memory chips. For example, assuming that errors occur in the data of the first page P0 of the flash memory chip 512 and the errors are uncorrectable by the data of the first page P0, the second codec 134 may read the data of all first pages P0 of the flash memory chips 512, 514, 522 and 524 and the first ECC S0 to perform error correction.

Further, during writing of first data, the flash memory controller 110 will perform read operations upon the written data to determine whether the data is successfully written. After the flash memory controller 110 determines that the first data has been successfully written to the first pages P0 of the flash memory chips 512, 514, 522 and 524, the flash memory controller 110 will reserve the first ECC S0. The flash memory controller 110 may temporarily store the first ECC S0 into a memory in advance, or encode the first ECC S0 with the first codec 132 and then store the first ECC S0 into a specific block of the flash memory chips 512, 514, 522 and 524, wherein the specific block does not belong to any page in the super block 530.

Next, when the flash memory controller 110 needs to write the second data to the super block 530, the second codec 134 in the flash memory controller 110 will encode the second data to generate the second ECC S1 in advance, wherein the second codec 134 may adopt the Reed-Solomon (RS) encoding algorithm or an exclusive-OR (XOR) calculation to encode the data written to the second page P1 of each of the flash memory chips 512, 514, 522 and 524, in order to generate the second ECC S1. After that, the first codec 132 encodes the second data to generate corresponding ECCs, respectively, and writes the second data and the ECC generated by the first codec 132 to the second page P1 in each of the flash memory chips 512, 514, 522 and 524. Further, during writing the second data, the flash memory controller 110 will perform read check operations upon the written data to determine whether the data has been successfully written or not. When the flash memory controller 110 determines that the second data has been successfully written to the second page P1 in the flash memory chips 512, 514, 522 and 524, the flash memory controller 110 will reserve the second ECC S1. The flash memory controller 110 may temporarily store the second ECC S1 in to the memory of the flash memory controller 110 in advance, or store the second ECC S1 into a specific block of the flash memory chips 512, 514, 522 and 524, wherein the specific block does not belong to the super block 530.

When an error occurs during writing of the second data, since the page P1 and the page P0 belong to the same word line group WL_G0, the error may also occur in the page P0. For example, assuming that an error occurs in the page P1 of the flash memory chip 514 when writing data, the error will also occur in the page P0 of flash memory chip 514 which has been successfully written. The reserved first ECC S0 may be used to correct the error of the page P0.

When the flash memory controller 110 needs to write the third data into the super block 530, the second codec 134 in the flash memory controller 110 will encode the third data to generate the third ECC S2 in advance, wherein the second codec 134 may adopt the RS encoding algorithm or an XOR calculation to encode the third page P2 written to each of the flash memory chips 512, 514, 522 and 524, to generate the third ECC S2. Then, the first codec 132 encodes the third data to generate corresponding ECCs, and writes the third data together with the ECC generated by the first codec 132 to the third page P2 of each of the flash memory chips 512, 514, 522 and 524. Further, during writing of the third data, the flash memory controller 110 will perform read checking upon the written data to determine whether the data is successfully written. After the flash memory controller 110 determines that the third data has been successfully written to the third pages P2 of the flash memory chips 512, 514, 522 and 524, the flash memory controller 110 will reserve the third ECC S2, wherein the flash memory controller 110 may temporarily store the third ECC S2 into the memory of the flash memory controller 110 in advance, or store the third ECC S2 into a specific block of the flash memory chips 512, 514, 522 and 524, wherein the specific block does not belong to the super block 530.

Next, when the flash memory controller 110 needs to write the fourth data into the super block 530, the second codec 134 in the flash memory controller 110 will encode the fourth data to generate the fourth ECC S3 in advance, wherein the second codec 134 may adopt the RS encoding algorithm or an XOR calculation to encode the data written to the fourth page P3 of each of the flash memory chips 512, 514, 522 and 524, to generate the fourth ECC S3. Then, the first codec 132 encodes the fourth data to generate corresponding ECCs, and then writes the fourth data and the ECC generated by the first codec 132 to the fourth page P3 of each of the flash memory chips 512, 514, 522 and 524. Further, during writing of the fourth data, the flash memory controller 110 may perform read checking upon the written data to determine whether the data is successfully written. When the flash memory controller 110 determines that fourth data has been successfully written to the fourth pages P2 of the flash memory chips 512, 514, 522 and 524, the flash memory controller 110 may reserve the fourth ECC S3, wherein the flash memory controller 110 may temporarily store the fourth ECC S3 into the memory of the flash memory controller 110 in advance, or store the fourth ECC S3 into a specific block of the flash memory chips 512, 514, 522 and 524, wherein the specific block does not belong to the super block 530.

Similarly, when errors occur during writing of the third and fourth data, since the pages P0, P1, P3 and P4 belong to the same word line group WL_G0, the pages P0 and P1 of the flash memory chips 512, 514, 522 and 524 may also be damaged. For example, assuming that an error occurs in the page P3 of the flash memory chip 524 during writing of data, the error will also occur in the pages P0, P1 and P2 which have been successfully written. The errors in the page P0, P1 and P2 can be corrected by utilizing the previously reserved first to third ECCs.

After the writing operations on all pages of the word line group WL_G0 are completed, if the previously reserved ECCs S0, S1, S2 and S3 are stored in a memory of the flash memory controller 110, the ECCs can be moved to the specific block in order to release the memory space of the flash memory controller 110.

Then, similar to the above steps, the flash memory controller 110 writes the following fifth to 192th data into the flash memory chips 512, 514, 522 and 524, and encodes the fifth to 192th data to generate the fifth to 192th ECCs S4-S191, respectively.

When errors occur during writing of data into the super block 530, since the flash memory cannot modify the written data, the written data needs to be read and corrected with the ECC stored in the specific block, and then the corrected data and other data which do not need correction will be written to another block.

Since the ECCs S0-S191 occupy a lot of space of the specific block, when it is determined that all data in the super block 530 has been successfully written, all ECCs S0-S191 stored in the specific block can be deleted to release some storage space. The flash memory controller 110 will erase the specific block in order to delete the ECCs S0-S191 (before the corresponding data is read for the first time). Note that "deleting the ECCs S0-S191" as mentioned above does not mean immediately erasing the specific block, but means labeling the specific block as "invalid", and then erasing the whole specific block at a proper timing (e.g. the timing when the flash memory controller 110 is not busy).

Note that the pages P0-P191 shown in FIG. 6 may represent more than one page (e.g. 1-4 pages). Specifically, in the case of SLC blocks, floating gate transistors on a word line form one page (e.g. the word line WL0 comprises only one page P0); in the case of MLC blocks, the floating gate transistors on a word line form two pages (e.g. P0 comprises two pages); in the case of TLC blocks, the floating gate transistors on a word line form three pages (e.g. P0 comprise three pages P0L, P0M and P0U as shown in FIG. 4); and in the case of QLC blocks, the floating gate transistors on a word line form four pages.

In this embodiment, the super block 530 may be MLC blocks, TLC blocks or QLC blocks. Since the specific block for storing the ECCs S0-S191 is frequently written and erased, an SLC block may be adopted as the specific block to increase the lifetime. When the super block 530 is a TLC block, since each word line corresponds to three pages, the ECCs S0-S191 will have to be stored with three specific blocks (i.e. SLC blocks).

Note that, in the above embodiments, the super block 530 is assumed to be a blank block, and the flash memory controller 110 writes data starting from the first page of each flash memory chip. The present invention is not limited thereto. In other embodiments, the super block 530 may have stored other data, and the flash memory controller 110 will sequentially store the data into the remaining pages of the super block 530, thus generating corresponding ECCs (e.g. the ECCs S0-SN). These designs also fall within the scope of the present invention.

In the above embodiments, data is encoded by the second codec 134 and then encoded by the first codec 132, before being written to the flash memory module 120. In some embodiments, however, the same result may be achieved by exchanging the execution order of the first codec 132 and the second codec 134.

Figure 7:
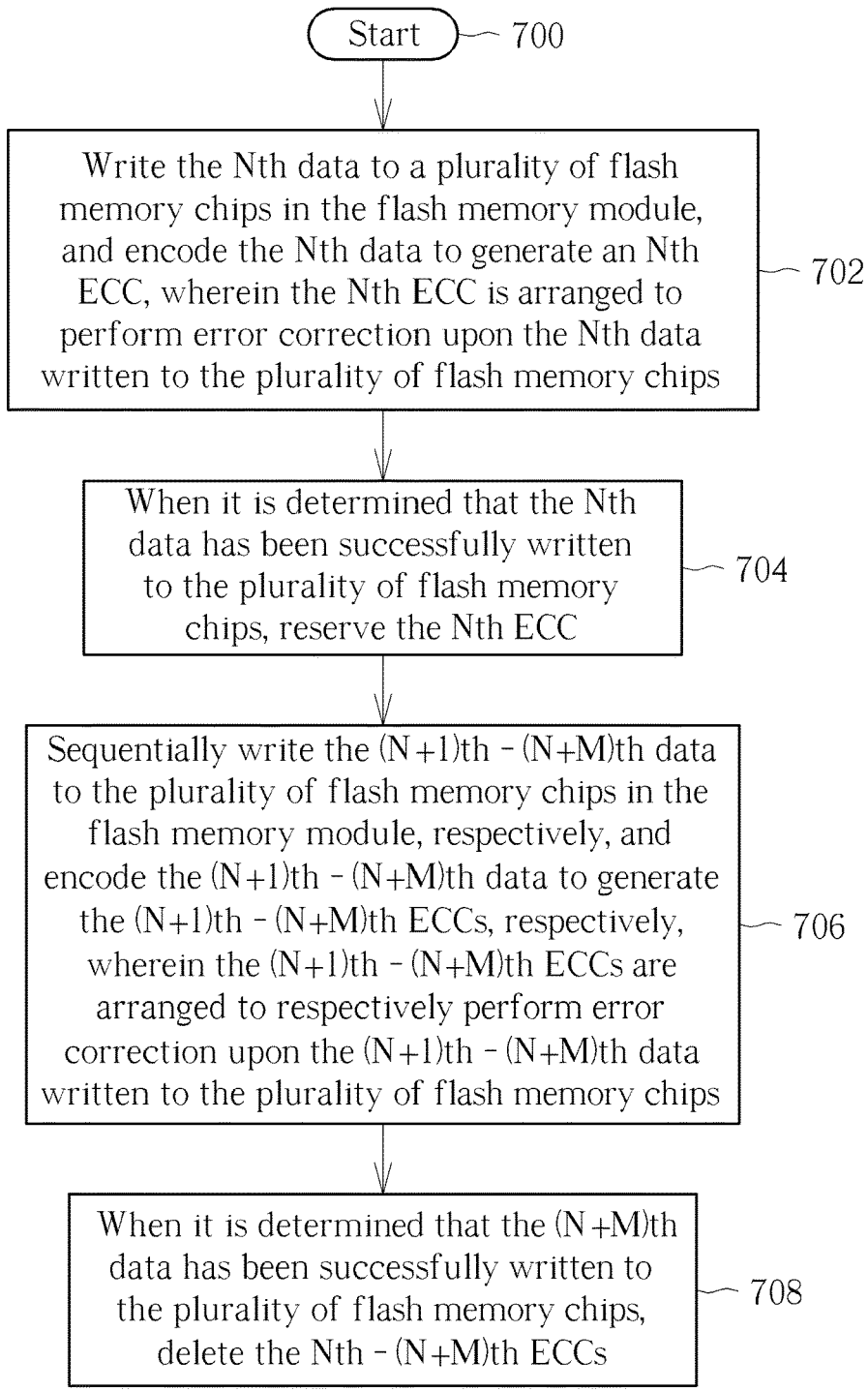
FIG. 7 is a flowchart illustrating a method of accessing a flash memory module according to an embodiment of the present invention.

Refer to FIG. 7, which is a flowchart illustrating a method of accessing a flash memory module 120 according to an embodiment of the present invention. The method comprises the following steps:
Step 700: Start;
Step 702: Write the Nth data to a plurality of flash memory chips in the flash memory module, and encode the Nth data to generate an Nth ECC, wherein the Nth ECC is arranged to perform error correction upon the Nth data written to the plurality of flash memory chips;
Step 704: When it is determined that the Nth data has been successfully written to the plurality of flash memory chips, reserve the Nth ECC;
Step 706: Sequentially write the (N+1)th-(N+M)th data to the plurality of flash memory chips in the flash memory module, respectively, and encode the (N+1)th-(N+M)th data to generate the (N+1)th-(N+M)th ECCs, respectively, wherein the (N+1)th-(N+M)th ECCs are arranged to respectively perform error correction upon the (N+1)th-(N+M)th data written to the plurality of flash memory chips; and
Step 708: When it is determined that the (N+M)th data has been successfully written to the plurality of flash memory chips, delete the Nth-(N+M)th ECCs.

By utilizing the above embodiments, the errors occurred when writing data to the 3D NAND-type flash memory can be corrected. In addition, the ECCs S0-S191 may be erased immediately after determining that all data in the super block 530 has been successfully written, in order to release the memory space.

In some circumstances, although data has been successfully written, it may not able to be read or errors may occur in the following read operations. For example, a portion of word lines in the flash memories 512, 514, 522 and 524 may encounter the open circuit problem, making the data unable to be read. Further, as described above, as long as one word line in a word line group has an open circuit, errors will occur in the data of the whole word line group. The present invention provides the following embodiment to solve this problem.

For better understanding, refer to FIGS. 4 and 5, which illustrate the flash memory controller 110 writing data to the super block 530. Refer to FIG. 8, which is a diagram illustrating the flash memory controller 110 writing data to the super block 530 according to a second embodiment of the present invention. Note that, in the following descriptions of this embodiment, "data" refers to the data written to a word line group, rather than the data on a word line as shown in the embodiment of FIG. 6. When the flash memory controller 110 writes the first data to the super block 530 (as mentioned in the embodiment of FIG. 6), the second codec 134 in the flash memory controller 110 will encode the first data to generate the first ECCs S0-S3, write the first data to the pages P0-P3 in each of the flash memory chips 512, 514, 522 and 524, respectively, and store the ECCs S0-S3 into a specific block of the flash memory chips 512, 514, 522 or 524, wherein the specific block does not belong to the super block 530.

Next, when the flash memory controller 110 needs to write the second data (which comprises 4 pages) to the super block 530, the second codec 134 in the flash memory controller 110 will first encode the ECC S0 and the data of the page P4 which is going to be written to the flash memory chips 512, 514, 522 and 524, to generate the ECC S4, wherein the second codec 134 may adopt the RS encoding algorithm or the XOR calculation to encode the ECC S0 and the data of the page P4 to be written to the flash memory chips 512, 514, 522 and 524, in order to generate the ECC S4.

Then, the first codec 132 encodes the data of the page P4 which is going to be written to the flash memory chips 512, 514, 522 and 524, respectively, to generate corresponding ECCs, and writes the data together with the ECC generated by the first codec 132 to the fifth page P4 of each of the flash memory chips 512, 514, 522 and 524. The flash memory controller 110 may temporarily store the ECC S4 into the memory of the flash memory controller 110 in advance, or store the ECC S4 into the specific block in each of the flash memory chips 512, 514, 522 and 524, wherein the specific block does not belong to the super block 530. Hence, unlike the ECCs S0-S3, the ECC S4 is generated based on the ECC S0.

Next, the memory controller 110 writes the second data which is going to be written to the pages P5-P7 of the flash memory chips 512, 514, 522 and 524 to the super block 530, and simultaneously generates the ECCs S5-S7, wherein the ECCs S5-S7 are generated based on the ECCs S1-S3, respectively.

Then, the memory controller 110 writes the third data to the super block 530, and simultaneously generates the third ECCs S8-S11. Similar to generating the second ECCs S4-S7, the third ECCs S8-S11 are generated based on the second ECCs S4-S7, respectively.

Similar to the above steps, the flash memory controller 110 writes the 4th-48th data to the flash memory chips 512, 514, 522 and 524, and encodes the 4th-48$^{th}$ data to generate the 4th-48th ECCs S12-S191, respectively.

When errors occur during writing data to the super block 530, since the flash memory cannot directly correct the written data, the written data needs to be read out first, and then corrected with an ECC stored in the specific block. After that, the corrected data and other data which does not need correction will be written to another block.

Note that, since each ECC is generated by referring to a previous ECC, each of the 48 ECCs S188-S191 substantially contains information of the previous ECC. Information of each ECC can be obtained by utilizing the 48th ECC. For example, the ECC S184 may be obtained through the second codec 134 referring to the contents of the page P188 of each of the flash memory chips 512, 514, 522 and 524 and the ECC S188; the ECC S180 may be obtained through the second codec 134 referring to the contents of the page P184 of the flash memory chips 512, 514, 522 and 524 and the ECC S184; the ECC S176 may be obtained through the second codec 134 referring to the contents of the page P180 of the flash memory chips 512, 514, 522 and 524 and the ECC S180, and so on. Finally, the ECC S0 can be obtained according to the above concept. Hence, when it is determined that all data in the super block 530 has been successfully written, the flash memory controller 110 may copy the ECCs S188-S191 to another block, and then erase the whole specific block, thus releasing the memory space.

As mentioned above, since the flash memory controller 110 reserves the ECCs S188-S191, the ECCs S188-S191 may be utilized to obtain the ECCs S0-S187. Hence, even if word lines of one of the flash memory chips 512, 514, 522 and 524 encounter the open circuit problem, the problem can be corrected by the corresponding ECCs S0-S191, thus solving the related art issue where data cannot be fixed.

In this embodiment, the super block 530 may be an MLC block, TLC block or QLC block. Since the specific block for storing the ECCs S0-S191 will frequently undergo writing or erasing, in order to increase the lifetime of the specific block, SLC blocks can be also applied. When the super block 530 is a TLC block, since each word line corresponds to three pages, the ECCs S0-S191 will need to be stored with three specific blocks (e.g. SLC blocks). Further, when the flash memory controller 110 copies the ECCs S188-191, the flash memory controller 110 may copy the ECCs S188-191 to a TLC block to release more memory space.

Note that the pages P0-P191 shown in FIG. 8 may represent more than one page, e.g. 1-4 pages. Specifically, when SLC blocks are adopted, the floating gate transistors on each word line form one page (e.g. the word line WL0 only has one page P0); when MLC block are adopted, the floating gate transistors on one word line form two pages (e.g. the page P0 has two pages); when TLC blocks are adopted, the floating gate transistors on one word line form three pages (e.g. the page P0 comprises three pages P0L, P0M and P0U shown in FIG. 4); and when QLC blocks are adopted, the floating gate transistors on one word line form four pages.

Figure 9:
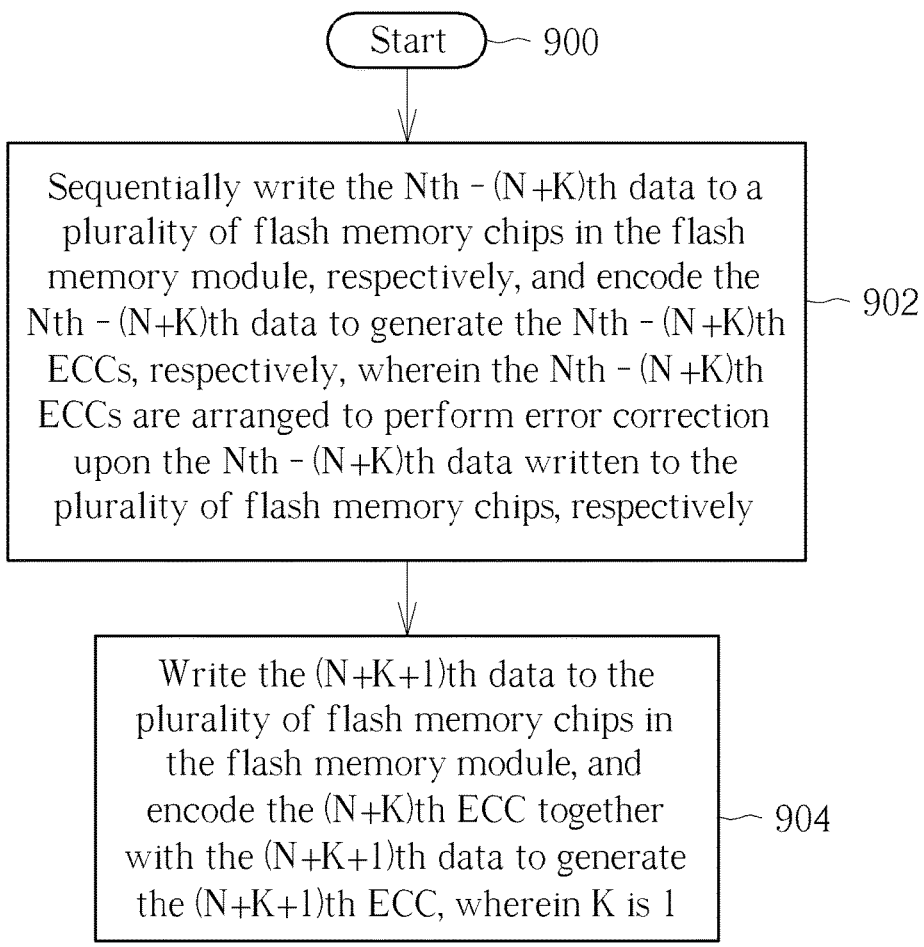
FIG. 9 is a flowchart illustrating a method of accessing a flash memory module according to another embodiment of the present invention.

Refer to FIGS. 8 and 9. FIG. 9 is a flowchart illustrating a method of accessing a flash memory module 120 according to another embodiment of the present invention, and comprises the following steps.

Step 900: Start;
Step 902: Sequentially write the Nth-(N+K)th data to a plurality of flash memory chips in the flash memory module, respectively, and encode the Nth-(N+K)th data to generate the Nth-(N+K)th ECCs, respectively, wherein the Nth-(N+K)th ECCs are arranged to perform error correction upon the Nth-(N+K)th data written to the plurality of flash memory chips, respectively; and
Step 904: Write the (N+K+1)th data to the plurality of flash memory chips in the flash memory module, and encode the (N+K)th ECC together with the (N+K+1)th data to generate the (N+K+1)th ECC, wherein K is 1.

The embodiments shown in FIGS. 8-9 may solve the word line open circuit problem which occurs in one of the flash memory chips 512, 514, 522 and 524, resulting in uncorrectable data. If, however, two word lines in two respective word line groups are shorted with respect to each other (e.g. the word lines WL3 and WL4 of the flash memory chip 512 are shorted as shown in FIG. 8), this will make the data on both word line groups WL_G0 and WL_G1 in the flash memory chip 512 unable to be read successfully. To solve this problem, the present invention provides an embodiment as follows.

For better understanding, refer to the examples shown in FIGS. 4-5, which show the flash memory controller 110 writing data to the super block 530. Refer to FIG. 10, which is a diagram illustrating the flash memory controller 110 writing data to a super block 530 according to a third embodiment of the present invention. For brevity, in the following descriptions of this embodiment, the term "data" represents the data written to a word line group rather than the data originally existing in the word line as shown in FIG. 6. When the flash memory controller 110 needs to write the first data to the super block 530, as in the embodiment of FIG. 6, the second codec 134 in the flash memory controller 110 will encode the first data to generate the first ECCs S0-S3, write the first data to the pages P0-P3 of each of the flash memory chips 512, 514, 522 and 524, respectively, and store the ECCs S0-S3 into a specific block of the flash memory chips 512, 514, 522 or 524, wherein the specific block does not belong to the super block 530. Next, the second codec 134 will encode the second data to generate the second ECCs S0-S3, and write the second data to the pages P4-P7 of each of the flash memory chips 512, 514, 522 and 524, respectively, and store the ECCs S4-S7 into the specific block.

Then, when the flash memory controller 110 needs to write the third data (which comprises 4 pages) to the super block 530, the second codec 134 in the flash memory controller 110 will encode the ECC S0 and the data of page P8 written to the flash memory chips 512, 514, 522 and 524 to generate the ECC S8 in advance, wherein the second codec 134 may adopt the RS encoding algorithm or an XOR calculation to encode the ECC S0 and the data of the ninth page P8 written to each of the flash memory chips 512, 514, 522 and 524, in order to generate the ECC S8. The first codec 132 then encodes the data of the page P8 respectively written to the flash memory chips 512, 514, 522 and 524, to generate the corresponding ECCs, and writes the data together with the ECC generated by the first codec 132 to the ninth page P8 in each of the flash memory chips 512, 514, 522 and 524. The flash memory controller 110 may temporarily store the ECC S8 into the memory of the flash memory controller 110 in advance, or store the ECC S8 into the specific block in the flash memory chips 512, 514, 522 and 524, wherein the specific block does not belong to the super block 530. As mentioned above, unlike the ECCs S0-S7, the ECC S8 is generated based on the ECC S0.

Next, the memory controller 110 writes the portion of the third data which is going to be written to the pages P9-P11 of the flash memory chips 512, 514, 522 and 524 to the super block 530, and simultaneously generates the ECCs S9-S11, wherein the ECCs S9-S11 are generated based on the ECCs S1-S3, respectively.

After that, the memory controller 110 will write the fourth data to the super block 530, and simultaneously generates the fourth ECCs S12-S15. Similar to the way of generating the third ECCs S8-S11, the fourth ECCs S12-S15 are generated based on the second ECCs S4-S7, respectively.

Similar to the above steps, the flash memory controller 110 will write the following 5th-48th data to the flash memory chips 512, 514, 522 and 524, and encode the 5th-48th data to generate the 5th-48th ECCs S16-S191, respectively.

When errors occur during the super block 530 writing process, since the flash memory cannot directly correct the written data, the written data must be read out first and then corrected with the ECC stored in the specific block. After the correction is completed, the corrected data along with other data not required to be corrected will be written to another block.

Note that, since each aforementioned ECC is generated based on the previous but one ECC, the 47th and 48th ECCs S184-S191 substantially contain the information of each previous ECC. Information of each ECC can be obtained by referring to the 47th and 48th ECCs. For example, the ECC S180 may be obtained through the second codec 134 referring to the contents of the page P188 of the flash memory chips 512, 514, 522 and 524 and the ECC S188; the ECC S172 may be obtained through the second codec 134 referring to the contents of the page P180 of the flash memory chips 512, 514, 522 and 524 and the ECC S180; the ECC S164 may be obtained through the second codec 134 referring to the contents of the page P172 of the flash memory chips 512, 514, 522 and 524 and the ECC S172, and so on. Finally, the ECC S0 can be obtained via the above method. After determining that all data in the super block 530 has been written, the flash memory controller 110 may copy the 47th and 48th ECCs S184-S191 to another block and then erase the whole specific block, to release the memory space.

As mentioned above, since the flash memory controller 110 reserves the ECCs S184-S191, and the ECCs S184-S191 may be arranged to obtain the ECCs S0-S183, even if one of the flash memory chips 512, 514, 522 and 524 encounters a word line short circuit problem, the problem can be corrected by utilizing the corresponding ECCs S0-191.

In this embodiment, the super block 530 may be an MLC block, TLC block or QLC block. Since the specific block for storing the ECCs S0-S191 will be frequently accessed when writing or erasing, in order to increase the lifetime of the specific block, SLC blocks can be also applied. Note that, when the super block 530 is a TLC block, since each word line corresponds to three pages, the ECCs S0-S191 will need to be stored with three specific blocks (e.g. SLC blocks). Further, when the flash memory controller 110 copies the ECCs S188-191, the flash memory controller 110 may copy the ECCs S188-191 to a TLC block, to release more memory space.

Note that the pages P0-P191 shown in FIG. 10 may represent more than one page, e.g. 1-4 pages. Specifically, when SLC blocks are adopted, the floating gate transistors on one word line form one page (e.g. the word line WL0 only comprises one page P0); when MLC blocks are adopted, the floating gate transistors on one word line form two pages (e.g. the page P0 in FIG. 10 comprises two pages); when TLC blocks are adopted, the floating gate transistors on one word line forms three pages (e.g. the page P0 shown in FIG. 10 comprises three pages P0L, P0M and P0U shown in FIG. 4); and when QLC blocks are adopted, the floating gate transistors on one word line forms four pages.

Figure 11:
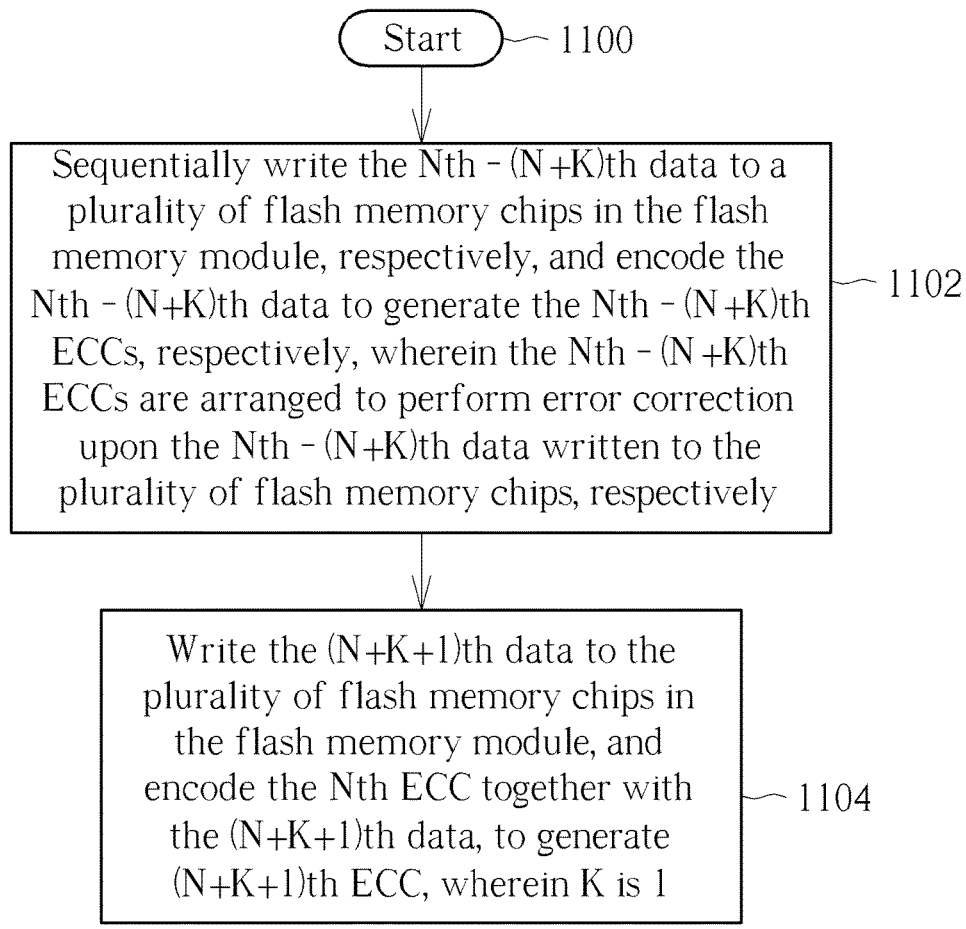
FIG. 11 is a flowchart illustrating a method of accessing a flash memory module according to another embodiment of the present invention.

Refer to FIG. 11, which is a flowchart illustrating a method of accessing a flash memory module 120 according to another embodiment of the present invention. The flowchart comprises the following steps:
Step 1100: Start;
Step 1102: Sequentially write the Nth-(N+K)th data to a plurality of flash memory chips in the flash memory module, respectively, and encode the Nth-(N+K)th data to generate the Nth-(N+K)th ECCs, respectively, wherein the Nth-(N+K)th ECCs are arranged to perform error correction upon the Nth-(N+K)th data written to the plurality of flash memory chips, respectively; and
Step 1104: Write the (N+K+1)th data to the plurality of flash memory chips in the flash memory module, and encode the Nth ECC together with the (N+K+1)th data, to generate (N+K+1)th ECC, wherein K is 1.

In the aforementioned embodiments, the flash memory module 120 is a 3D NAND-type flash memory module, but the present invention is not limited thereto. In some embodiments, the flash memory module 120 may be a 2D NAND-type flash memory module. Since one skilled in the art will know how to apply the aforementioned embodiments to a 2D NAND-type flash memory module, the detailed descriptions thereof are omitted here for brevity.

To summarize, in the proposed methods for accessing a flash memory module, the ECCs are generated by performing error correction similar to redundant disk array, thereby avoiding writing errors occurring in 3D NAND-type flash memories. The aforementioned ECC may be temporarily stored in the flash memory, and deleted once block data is successfully written. The storage space of the flash memory module can be released, thereby reducing the memory requirement of the flash memory controller. Further, a portion of the aforementioned generated ECC can be reserved to correct following errors due to an open circuit/short circuit of word lines. This may further ensure data security without considerably wasting storage space of the flash memory module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for accessing a flash memory module, wherein the flash memory module is a 3D flash memory module, and the method comprises:
sequentially writing Nth-(N+K)th data to floating gate transistors of different word line groups of each of a plurality of flash memory chips of the flash memory module, wherein each of the word line groups comprises a plurality of word lines, and encoding the Nth-(N+K)th data to generate Nth-(N+K)th error correction codes (ECCs), respectively, where the Nth-(N+

K)th ECCs are used to correct errors of the Nth-(N+K)th data, respectively, and N and K are positive integers;

writing (N+K+1)th data to floating gate transistors of another word line group of each of the plurality of flash memory chips of the flash memory module, and encoding the (N+K+1)th data with at least one of the Nth-(N+K)th ECCs, to generate (N+K+1)th ECC;

writing the (N+K+1)th ECC, or writing the (N+K)th ECC and (N+K+1)th ECC, to a specific block of the flash memory module that is different from block(s) storing the Nth-(N+K+1)th data, and deleting the Nth-(N+K−1)th ECCs from the 3D flash memory module;

reading specific data from the block(s) of the flash memory module, wherein the specific data is not the (N+K)th data or the (N+K+1)th data; and when an error that is uncorrectable when reading the specific data, reading the (N+K+1)th ECC stored in the specific block, or reading the (N+K)th and the (N+K+1)th ECC stored in the specific block, to perform error correction upon the specific data.

2. The method of claim 1, wherein K is 1, and the step of generating the (N+K+1)th ECC comprises:
encoding the (N+K)th ECC together with the (N+K+1)th data to generate the (N+K+1)th ECC.

3. The method of claim 1, wherein K is 1, and the step of generating the (N+K+1)th ECC comprises:
encoding the Nth ECC together with the (N+K+1)th data to generate the (N+K+1)th ECC.

4. The method of claim 1, wherein K is an integer within 1−M, and the Nth data is written to a first page of a super block of the plurality of flash memory chips, wherein the super block comprises a block of each flash memory chip of the plurality of flash memory chips; and the (N+M+1)th data is written to a last page of the super block of the plurality of flash memory chips.

5. The method of claim 4, wherein the step of generating the (N+K+1)th ECC comprises
encoding the (N+K)th ECC together with the (N+K+1)th data to generate the (N+K+1)th ECC.

6. The method of claim 4, wherein the step of generating the (N+K+1)th ECC comprises:
encoding the (N+K−1)th ECC together with the (N+K+1)th data to generate the (N+K+1)th ECC.

7. The method of claim 1, wherein the specific block is a single-level cell (SLC) block.

8. The method of claim 1, wherein K is an integer within 1−M, and the Nth data is written to a first page of a super block of the plurality of flash memory chips, wherein the super block comprise a block of each flash memory chip of the plurality of flash memory chips; and the (N+M+1)th data is written to a last page of the super block of the plurality of flash memory chips.

9. A flash memory controller, arranged to access a flash memory module, wherein the flash memory module is a 3D flash memory module, and the flash memory controller comprises:
a memory, arranged to store a program code;
a microprocessor, arranged to execute the program code, to control access of the flash memory module; and
an encoder;
wherein the microprocessor sequentially writes the Nth-(N+K)th data to floating gate transistors of different word line groups of each of a plurality of flash memory chips in the flash memory module, respectively, wherein each of the word line groups comprises a plurality of word lines, and the encoder encodes the Nth-(N+K)th data to generate Nth-(N+K)th ECCs, respectively, the Nth-(N+K)th ECCs are arranged to perform error correction upon the Nth-(N+K)th data written to the plurality of flash memory chips, and N and K are positive integers; and the microprocessor writes (N+K+1)th data to floating gate transistors of another word line group of each of the plurality of flash memory chips of the flash memory module, and the encoder encodes at least one of the Nth-(N+K)th ECCs together with the (N+K+1)th data, to generate (N+K+1)th ECC; and the microprocessor writes the (N+K+1)th ECC, or writes the (N+K)th ECC and (N+K+1)th ECC, to a specific block of the flash memory module that is different from block(s) storing the Nth-(N+K+1)th data, and deletes the Nth-(N+K−1)th ECCs from the 3D flash memory module; the microprocessor further reads specific data from the block(s) of the flash memory module, wherein the specific data is not the (N+K)th data or the (N+K+1)th data; and when an error that is uncorrectable when reading the specific data, the microprocessor reads the (N+K+1)th ECC stored in the specific block, or reads the (N+K)th and the (N+K+1)th ECC stored in the specific block, to perform error correction upon the specific data.

10. The flash memory controller of claim 9, wherein K is 1, and the encoder encodes the (N+K)th ECC together with the (N+K+1)th data to generate the (N+K+1)th ECC.

11. The flash memory controller of claim 9, wherein K is 1, and the encoder encodes the Nth ECC together with the (N+K+1)th data to generate (N+K+1)th ECC.

12. The flash memory controller of claim 9, wherein K is an integer within 1−M, and the Nth data is written to a first page of a super block of the plurality of flash memory chips, wherein the super block comprises a block of each flash memory chip within the plurality of flash memory chips; and the (N+M+1)th data is written to a last page of the super block of the plurality of flash memory chips.

13. The flash memory controller of claim 12, wherein the encoder encodes the (N+K)th ECC together with the (N+K+1)th data to generate the (N+K+1)th ECC.

14. The flash memory controller of claim 12, wherein the encoder encodes the (N+K−1)th ECC together with the (N+K+1)th data to generate the (N+K+1)th ECC.

15. The flash memory controller of claim 9, wherein the specific block is a single-level cell (SLC) block.

16. The flash memory controller of claim 9, wherein K is an integer within 1−M, and the Nth data is written to a first page of a super block of the plurality of flash memory chips, wherein the super block comprises a block of each flash memory chip within the plurality of flash memory chips; and the (N+M+1)th data is written to a last page of the super block of the plurality of flash memory chips.

17. A memory apparatus, comprising:
a flash memory module, wherein the flash memory module is a 3D flash memory module; and
a flash memory controller, arranged to access the flash memory module;
wherein the flash memory controller sequentially writes Nth-(N+K)th data to floating gate transistors of different word line groups of each of a plurality of flash memory chips in the flash memory module, respectively, wherein each of the word line groups comprises a plurality of word lines, and encodes the Nth-(N+K)th data to generate Nth-(N+K)th ECCs, respectively; the Nth-(N+K)th ECCs are arranged to perform error correction upon the Nth-(N+K)th data written to the plurality of flash memory chips, and N and K are positive integers; and the flash memory controller writes (N+K+1)th data to floating gate transistors of another word line group of each of the plurality of flash memory chips in the flash memory module, and encodes at least one of the Nth-(N+K)th ECCs together with the (N+K+1)th data, to generate (N+K+1)th ECC; and the flash memory controller writes the (N+K+1)th ECC, or writes the (N+K)th ECC and (N+K+1)th ECC, to a specific block of the flash memory module that is different from block(s) storing the Nth-(N+K+1)th data, and deletes the Nth-(N+K−1)th ECCs from the 3D flash memory module; the flash memory controller further reads specific data from the block(s) of the flash memory module, wherein the specific data is not the (N+K)th data or the (N+K+1)th data; and when an error that is uncorrectable when reading the specific data, the flash memory controller reads the (N+K+1)th ECC stored in the specific block, or reads the (N+K)th and the (N+K+1)th ECC stored in the specific block, to perform error correction upon the specific data.

18. The memory apparatus of claim 17, wherein the flash memory controller writes the Nth-(N+K+1)th data to a plurality of blocks of the plurality of flash memory chips, and the plurality of blocks are multiple-level cell (MLC) blocks, triple-level cell (TLC) blocks, or quad-level cell (QLC) blocks; and the flash memory controller writes the Nth-(N+K+1)th ECCs to at least one specific block of the flash memory module, wherein the specific block is an SLC block.

* * * * *